(12) United States Patent
Van Der Schaar et al.

(10) Patent No.: US 7,898,662 B2
(45) Date of Patent: Mar. 1, 2011

(54) METHOD AND APPARATUS FOR ANGULAR-RESOLVED SPECTROSCOPIC LITHOGRAPHY CHARACTERIZATION

(75) Inventors: Maurits Van Der Schaar, Veldhoven (NL); Arie Jeffrey Den Boef, Waalre (NL); Everhardus Cornelis Mos, Best (NL); Stefan Carolus Jacobus Antonius Keij, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 561 days.

(21) Appl. No.: 11/455,942

(22) Filed: Jun. 20, 2006

(65) Prior Publication Data

US 2007/0291269 A1 Dec. 20, 2007

(51) Int. Cl.
*G01B 11/00* (2006.01)
(52) U.S. Cl. ....................................... 356/401
(58) Field of Classification Search ................. 356/566, 356/399–401
See application file for complete search history.

(56) References Cited

U.S. PATENT DOCUMENTS

| | | | |
|---|---|---|---|
| 4,200,395 A | 4/1980 | Smith et al. | |
| 5,017,514 A | 5/1991 | Nishimoto | |
| 5,521,036 A * | 5/1996 | Iwamoto et al. | 430/22 |
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 5,966,201 A | 10/1999 | Shiraishi et al. | |
| 6,150,231 A | 11/2000 | Muller et al. | |
| 6,239,031 B1 | 5/2001 | Kepler et al. | |
| 6,356,343 B1 | 3/2002 | Shiraishi et al. | |
| 6,388,341 B2 | 5/2002 | Arai et al. | |
| 6,486,954 B1 | 11/2002 | Mieher et al. | |
| 6,521,900 B1 | 2/2003 | Hirayanagi | |
| 6,573,975 B2 | 6/2003 | Govil et al. | |

(Continued)

FOREIGN PATENT DOCUMENTS

JP 53-137673 A 12/1978

(Continued)

OTHER PUBLICATIONS

English Abstract of Japanese Patent Publication No. JP 63-153818 A published Jun. 27, 1988, 1 pg.

(Continued)

*Primary Examiner*—Tarifur Chowdhury
*Assistant Examiner*—Michael LaPage
(74) *Attorney, Agent, or Firm*—Sterne, Kessler, Goldstein & Fox P.L.L.C.

(57) ABSTRACT

An overlay target on a substrate includes two sets of gratings; the first set having a pitch P1 and the second set having a pitch P2 and each set including a grating with an orientation substantially perpendicular to the first grating of each set. When a layer of resist is to be aligned with the layer below it, the same overlay marks are provided on the upper layer and the relative positions of the overlay targets on the upper layer and the lower layer are compared by shining an overlay beam on to the overlay targets and measuring the diffraction spectrum of the reflected beam. Having two sets of overlay targets with different pitches in gratings enables the measurement of overlay errors that are greater than the pitch of either one of the overlay gratings.

15 Claims, 4 Drawing Sheets

U.S. PATENT DOCUMENTS

| | | |
|---|---|---|
| 6,608,690 B2 | 8/2003 | Niu et al. .................... 356/635 |
| 6,699,624 B2 | 3/2004 | Niu et al. ....................... 430/5 |
| 6,704,661 B1 | 3/2004 | Opsal et al. .................... 702/27 |
| 6,721,691 B2 | 4/2004 | Bao et al. .................... 702/189 |
| 6,738,138 B2 | 5/2004 | Wei ............................ 356/369 |
| 6,753,961 B1 | 6/2004 | Norton et al. ................ 356/364 |
| 6,768,983 B1 | 7/2004 | Jakatdar et al. ............... 706/46 |
| 6,772,084 B2 | 8/2004 | Bischoff et al. ............. 702/127 |
| 6,785,638 B2 | 8/2004 | Niu et al. .................... 702/189 |
| 6,813,034 B2 | 11/2004 | Rosencwaig et al. ........ 356/601 |
| 6,819,426 B2 | 11/2004 | Sezginer et al. ............. 356/401 |
| 6,844,918 B2 | 1/2005 | Navarro Y Koren et al. |
| 6,856,408 B2 | 2/2005 | Raymond .................... 356/601 |
| 6,876,092 B2 | 4/2005 | Ballarin |
| 6,919,964 B2 | 7/2005 | Chu ............................ 356/601 |
| 6,921,916 B2 | 7/2005 | Adel et al. |
| 6,922,230 B2 | 7/2005 | Govil et al. |
| 6,928,628 B2 | 8/2005 | Seligson et al. ................. 716/4 |
| 6,963,389 B2 | 11/2005 | Fukada |
| 6,972,852 B2 | 12/2005 | Opsal et al. .................. 356/625 |
| 6,974,962 B2 | 12/2005 | Brill et al. .................... 250/548 |
| 6,982,793 B1 * | 1/2006 | Yang et al. ................... 356/401 |
| 6,985,618 B2 | 1/2006 | Adel et al. |
| 6,985,793 B2 | 1/2006 | Landers et al. |
| 6,987,572 B2 | 1/2006 | Lakkapragada et al. ..... 356/601 |
| 6,995,831 B2 | 2/2006 | Levasier et al. |
| 7,002,667 B2 | 2/2006 | Levasier et al. |
| 7,046,376 B2 | 5/2006 | Sezginer ...................... 356/601 |
| 7,061,615 B1 | 6/2006 | Lowe-Webb ................ 356/401 |
| 7,061,623 B2 | 6/2006 | Davidson .................... 356/497 |
| 7,061,627 B2 | 6/2006 | Opsal et al. .................. 356/601 |
| 7,068,363 B2 | 6/2006 | Bevis et al. ............... 356/237.5 |
| 7,112,813 B2 | 9/2006 | Den Boef et al. |
| 7,242,477 B2 | 7/2007 | Mieher et al. |
| 7,259,828 B2 | 8/2007 | Tolsma et al. |
| 7,280,212 B2 | 10/2007 | Mieher et al. |
| 7,283,236 B2 | 10/2007 | Presura et al. |
| 7,298,481 B2 | 11/2007 | Mieher et al. |
| 7,317,531 B2 | 1/2008 | Mieher et al. |
| 7,433,040 B2 | 10/2008 | Mieher et al. |
| 7,556,898 B2 | 7/2009 | Marokkey |
| 7,687,925 B2 | 3/2010 | Marokkey et al. |
| 2003/0021467 A1 * | 1/2003 | Adel et al. .................. 382/151 |
| 2003/0160163 A1 * | 8/2003 | Wong et al. ............. 250/237 R |
| 2004/0066496 A1 * | 4/2004 | Govil et al. .................... 355/52 |
| 2004/0119970 A1 | 6/2004 | Dusa et al. ............... 356/237.1 |
| 2004/0130690 A1 * | 7/2004 | Koren et al. ................... 355/53 |
| 2005/0012928 A1 * | 1/2005 | Sezginer et al. ............. 356/401 |
| 2006/0025059 A1 | 2/2006 | Gueorguiev et al. |
| 2006/0033921 A1 | 2/2006 | Den Boef et al. |
| 2006/0066855 A1 | 3/2006 | Boef et al. ................... 356/401 |
| 2006/0126074 A1 | 6/2006 | Van Der Werf et al. ..... 356/489 |
| 2006/0139592 A1 | 6/2006 | Den Boef et al. ............. 355/53 |
| 2007/0077503 A1 | 4/2007 | Yoo |
| 2010/0091284 A1 * | 4/2010 | Mieher et al. ................ 356/401 |

FOREIGN PATENT DOCUMENTS

| | | |
|---|---|---|
| JP | 63-153818 A | 6/1988 |
| JP | 63-260045 A | 10/1988 |
| JP | 2-143544 A | 6/1990 |
| JP | 3-278513 A | 12/1991 |
| JP | 6-045225 A | 2/1994 |
| JP | 8-008156 A | 1/1996 |
| JP | 9-152309 A | 6/1997 |
| JP | 10-189443 A | 7/1998 |
| JP | 10-270346 A | 10/1998 |
| JP | 2000-012459 A | 1/2000 |
| JP | 2000-252203 A | 9/2000 |
| JP | 2001-297958 A | 10/2001 |
| JP | 2002-110507 A | 4/2002 |
| JP | 2002-359184 A | 12/2002 |
| JP | 2003-007608 A | 1/2003 |
| JP | 2003-092257 A | 3/2003 |
| JP | 2004-282017 A | 10/2004 |
| JP | 2005-216872 A | 8/2005 |
| JP | 2005-328061 A | 11/2005 |
| JP | 2006-041506 A | 2/2006 |
| JP | 2007-073970 A | 3/2007 |
| JP | 2007-096292 A | 4/2007 |
| JP | 2007-103928 A | 4/2007 |
| WO | WO 99/39376 A1 | 8/1999 |
| WO | WO 02/18871 A1 | 3/2002 |
| WO | WO 02/19415 A1 | 3/2002 |
| WO | WO 2004/053426 A1 | 6/2004 |
| WO | WO 2004/076963 A2 | 9/2004 |
| WO | WO 2004/107415 A1 | 12/2004 |
| WO | WO 2005/079498 A2 | 9/2005 |

OTHER PUBLICATIONS

English Abstract of Japanese Patent Publication No. JP 63-260045 A published Oct. 27, 1988, 1 pg.

English Abstract of Japanese Patent Publication No. JP 3-278513 A published Dec. 10, 1991, 1 pg.

English Abstract of Japanese Patent Publication No. JP 6-045225 A published Feb. 18, 1994, 1 pg.

English Abstract of Japanese Patent Publication No. JP 8-008156 A published Jan. 12, 1996, 1 pg.

English Abstract of Japanese Patent Publication No. JP 9-152309 A published Jun. 10, 1997, 1 pg.

English Abstract of Japanese Patent Publication No. JP 10-270346 A published Oct. 9, 1998, 1 pg.

English Abstract of Japanese Patent Publication No. JP 2002-110507 A published Apr. 12, 2002, 1 pg.

English Abstract of Japanese Patent Publication No. JP 2004-507901 T published Mar. 11, 2004, 1 pg.

English Abstract of Japanese Patent Publication No. JP 2004-508711 T published Mar. 18, 2004, 1 pg.

English Abstract of Japanese Patent Publication No. JP 2006-509219 T published Mar. 16, 2006, 1 pg.

English Abstract of Japanese Patent Publication No. JP 2006-518942 T published Aug. 17, 2006, 1 pg.

English Abstract of Japanese Patent Publication No. JP 2007-527531 T published Sep. 27, 2007, 1 pg.

* cited by examiner

METHOD AND APPARATUS FOR ANGULAR-RESOLVED SPECTROSCOPIC LITHOGRAPHY CHARACTERIZATION

BACKGROUND OF THE INVENTION

1. Field of the Invention

The present invention relates to methods of inspection usable, for example, in the manufacture of devices by lithographic techniques and to methods of manufacturing devices using lithographic techniques.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to determine features of the substrate, such as its alignment relative to previous exposures, a beam is reflected off the surface of the substrate, for example at an overlay target, and an image is created on a camera of the reflected beam. By comparing the properties of the beam before and after it has been reflected off the substrate, the properties of the substrate can be determined. This can be done, for example, by comparing the reflected beam with data stored in a library of known measurements associated with known substrate properties.

A property of a substrate that is monitored is the alignment of the substrate before it is exposed. A substrate will undergo several iterations of being covered in resist, exposed and processed to remove the unexposed resist. Each time a new layer of resist is applied to the substrate in preparation for exposure, the substrate must be aligned properly so that the new layer of resist is exposed in the same places as the previous layer of resist, to ensure that the resulting pattern is as sharp as possible. The method of ensuring the alignment must be precise, but to ensure throughput of the substrates is not compromised, the overlay method must also be quick.

The state of the art describes the use of overlay markers on the surface of the substrate. Each time a layer of resist is applied, an overlay marker is exposed, etched or otherwise created on the layer of resist and this overlay marker is compared with the marker on the substrate surface (or on the layer below it if the previous layer of resist has not been removed at that point). The overlay marker will often take the shape of a grating. The overlap of one grating on another is detectable using an overlay radiation beam by measuring the diffraction pattern of the beam as it is reflected from the surface of the superposed overlay markers.

However, these sorts of overlay markers detect only the relative position of one bar of a grating (i.e. the width of the pitch of the grating) with respect to the position of the bar underneath it. If the gratings are misaligned by more than the width of a grating pitch, there is no way, from the diffraction pattern, to determine this. In other words, misalignment below a certain threshold (the width of the grating pitch) can be measured, but errors over this threshold may be easily missed. Of course, large errors in alignment cause large errors in the exposed pattern and the substrates with these misexposures will often need to be discarded or completely stripped and redone.

SUMMARY OF THE INVENTION

It is desirable to provide an overlay system that is capable of recognizing large overlay errors, particularly overlay errors that are larger than the pitch of the overlay marker grating.

According to an embodiment of the invention, there is provided a substrate comprising an overlay target, the overlay target comprising two or more superposed layers; each layer containing like overlay targets, the overlay target in each layer comprising two or more gratings, the gratings having a different pitch from each other.

According to another embodiment of the invention, there is provided a substrate comprising an overlay target, wherein the overlay target comprises two superposed layers, each layer containing two gratings set in perpendicular axes of the substrate, each grating comprising an array of rectangular structures, the arrays of rectangular structures having a first pitch in a first direction and a second pitch in the perpendicular direction.

According to another embodiment of the invention, there is provided an inspection apparatus configured to measure a property of the substrate, comprising: an exposure tool for exposing an overlay target on the substrate; a light source for illuminating an overlay target on a substrate; and a detector for detecting the diffraction spectrum of the light reflected from the overlay target of the substrate, wherein the overlay target comprises two or more superposed layers, each layer containing two or more gratings, the orientation of the gratings being perpendicular to each other and having different pitches from each other.

According to another aspect of the invention, there is provided an inspection method comprising: applying a first grating on a substrate, the first grating having a first pitch; applying a second grating on the substrate, the second grating having an orientation perpendicular to the first grating and a pitch different from the pitch of the first grating; applying a layer of resist onto the substrate; applying, to the resist layer, a first and a second grating similar to the first and second gratings of the substrate such that each grating on the substrate has a second grating superposed onto it; illuminating the superposed gratings with an overlay radiation beam; measuring the diffraction spectra of light reflected from the superposed gratings; and comparing the measured diffraction spectra from each perpendicular superposed grating pair with each other and with model data to determine the extent of overlay of superposed gratings.

According to another embodiment of the invention, there is provided an inspection method comprising: applying a first grating on a substrate, the grating comprising an array of rectangular structures with a first pitch in a first direction and a second pitch in a perpendicular direction; applying a second grating on the substrate, the second grating comprising an array of rectangular structures orientated perpendicularly with respect to the first grating, the array of rectangular structures having the second pitch in the first direction and the first pitch in the perpendicular direction; applying a layer of resist onto the substrate; applying, to the resist layer, a first and a second grating similar to the first and second gratings of the substrate such that each grating on the substrate has a second grating superposed onto it; illuminating the superposed gratings with an overlay radiation beam; measuring the diffraction spectra of light reflected from the superposed gratings; and comparing the measured diffraction spectra from each perpendicular superposed grating pair with each other and with model data to determine the extent of overlay of superposed gratings.

According to yet another embodiment of the invention, there is provided a lithographic apparatus configured to measure a property of a substrate, comprising: an exposure tool for exposing an overlay target on the substrate, the overlay target comprising two or more superposed layers, each layer containing two or more gratings, the gratings having a different pitch from each other; a radiation source for supplying an overlay beam to illuminate the overlay target; and a detector for detecting the diffraction spectrum of the overlay beam reflected from the overlay target.

According to yet a further embodiment of the invention, there is provided a lithographic cell configured to measure a property of a substrate, comprising an exposure tool for exposing an overlay target on the substrate, the overlay target comprising two superposed layers, each layer containing two or more gratings, the gratings having a different pitch from each other; a radiation source for supplying an overlay beam to illuminate the overlay target; and a detector for detecting the diffraction spectrum of the overlay beam reflected from the overlay target.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
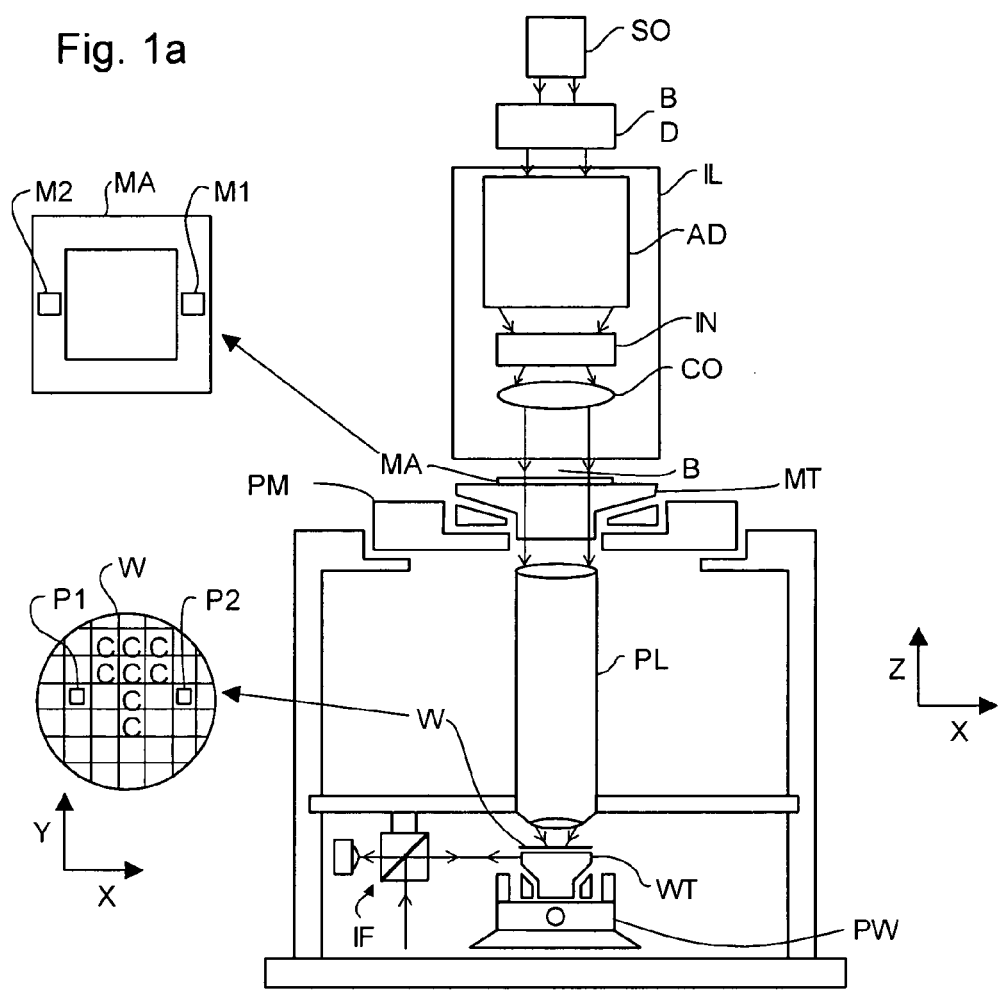
FIG. 1a depicts a lithographic apparatus according to an embodiment of the present invention.

FIG. 1a schematically depicts a lithographic apparatus. The apparatus comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT configured to hold a substrate (e.g. a resist-coated wafer) W and connected to a second positioner PW configured to accurately position the substrate in accordance with certain parameters. A projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask overlay marks M1, M2 and substrate overlay marks P1, P2. Although the substrate overlay marks as illustrated occupy dedicated target portions, they may be located in spaces between target portions (these are known as scribe-lane overlay marks). Similarly, in situations in which more than one die is provided on the mask MA, the mask overlay marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
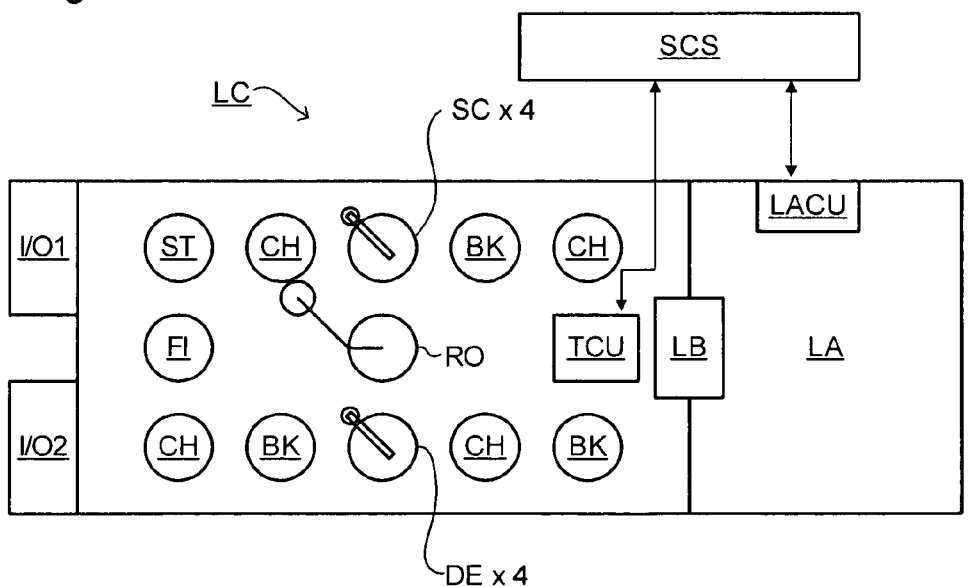
FIG. 1b depicts a lithographic cell or cluster according to an embodiment of the present invention.

As shown in FIG. 1b, the lithographic apparatus LA forms part of a lithographic cell LC, also sometimes referred to a lithocell (lithographic cell) or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus. Thus, the different apparatus can be operated to maximize throughput and processing efficiency.

As discussed above, each time a substrate undergoes an exposure process, it is desirable that the substrate is in the same orientation with respect to the exposure device as for previous exposures. This is so that the exposed patterns are in alignment in each resist layer. Errors in alignment cause errors in the exposed pattern on the substrate, causing the substrate to be less useful. The relative alignment of the substrate is therefore detected (by measuring the overlay of subsequent layers on the substrate) and any errors calculated and compensated for by the exposure apparatus or by the post-exposure processes, where possible.

An inspection apparatus separate from the lithographic apparatus (the latter containing the exposure apparatus) is used to determine the properties of the substrates, and in particular, how the properties of substrates vary from layer to layer and from substrate to substrate. The inspection apparatus is thereby also used to determine how properties of substrates vary from lithography machine to lithography machine and is therefore useful in determining how each lithography machine should be calibrated in order to produce a consistent product even with a series of apparatuses.

As mentioned above, the diffraction spectrum of superposed gratings in the scribe lane of a substrate has been used to determine the misalignment of the substrate. The scribe lane of a substrate is the area on the substrate surface that is not used for exposing the pattern and may be the lanes which will eventually be cut (e.g. by a saw) in order to separate individual integrated circuits.

The way the overlay markers in the form of gratings work is that when an overlay beam is directed on to a grating that is either in line with the grating below it or not superposed on another grating at all, a specific diffraction spectrum is created in the overlay beam being reflected off the grating. However, misalignment of the gratings causes a slight shift in the diffraction spectrum which can be seen over various diffraction orders. The larger the misalignment, the larger the change in the diffraction spectrum. The problem with the prior art lies in the fact that if a grating that is superposed on a first grating is misaligned by exactly the pitch of the grating, the diffraction spectrum will only show that the bars of the grating are aligned.

Figure 2:
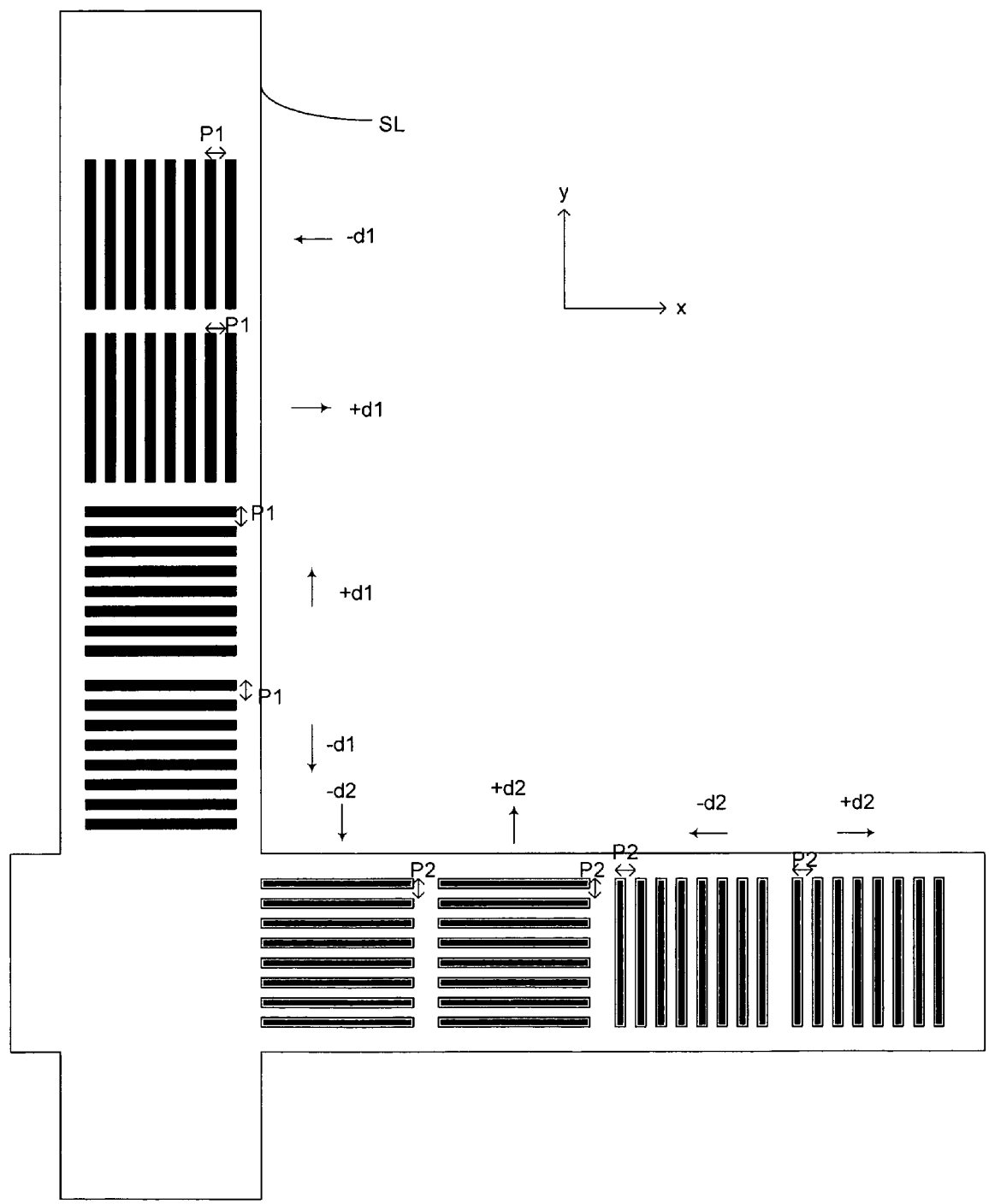
FIG. 2 depicts overlay markers according to a first embodiment of the invention.
Figure 3:
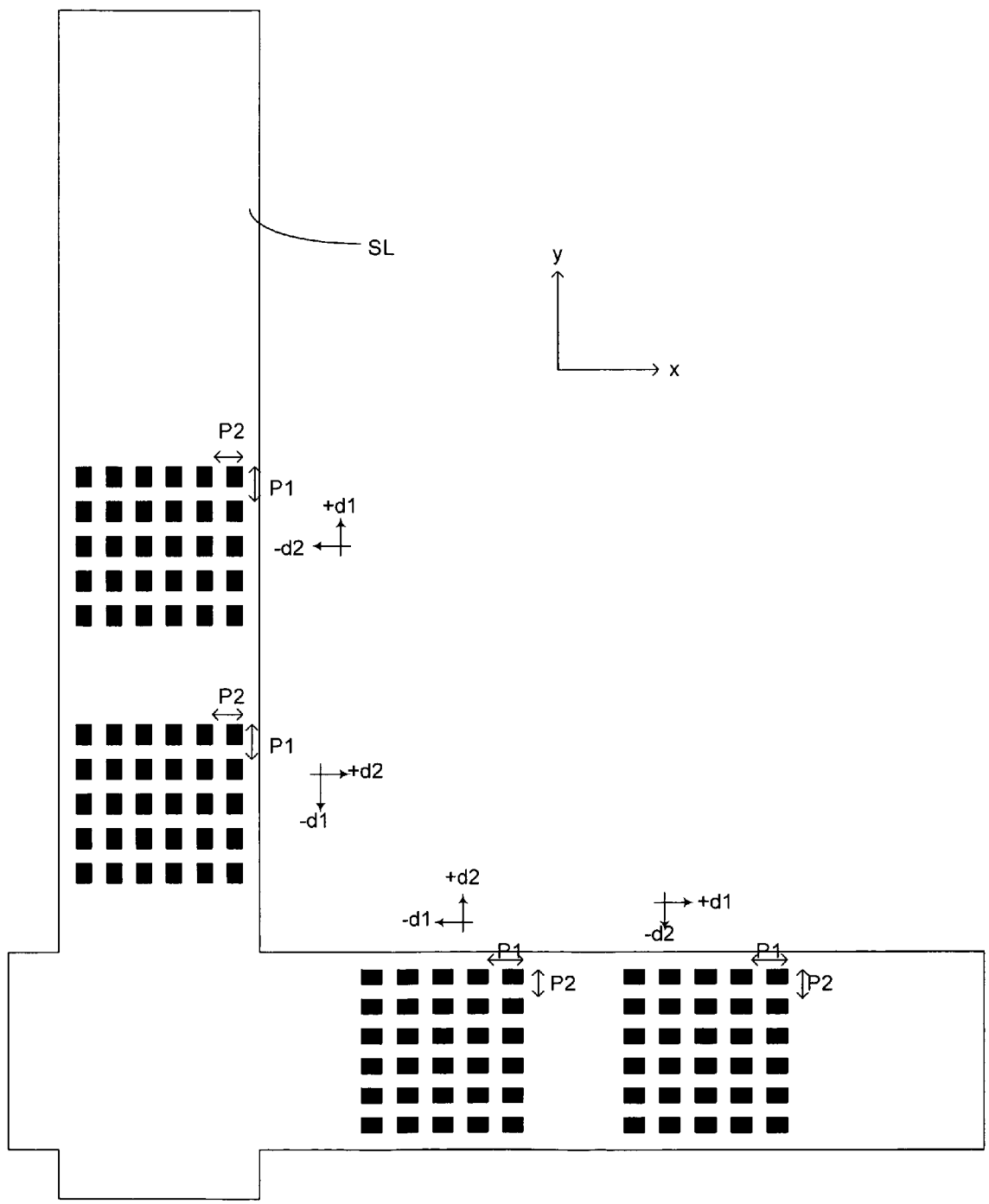
FIG. 3 depicts overlay markers according to a second embodiment of the invention.
Figure 4:
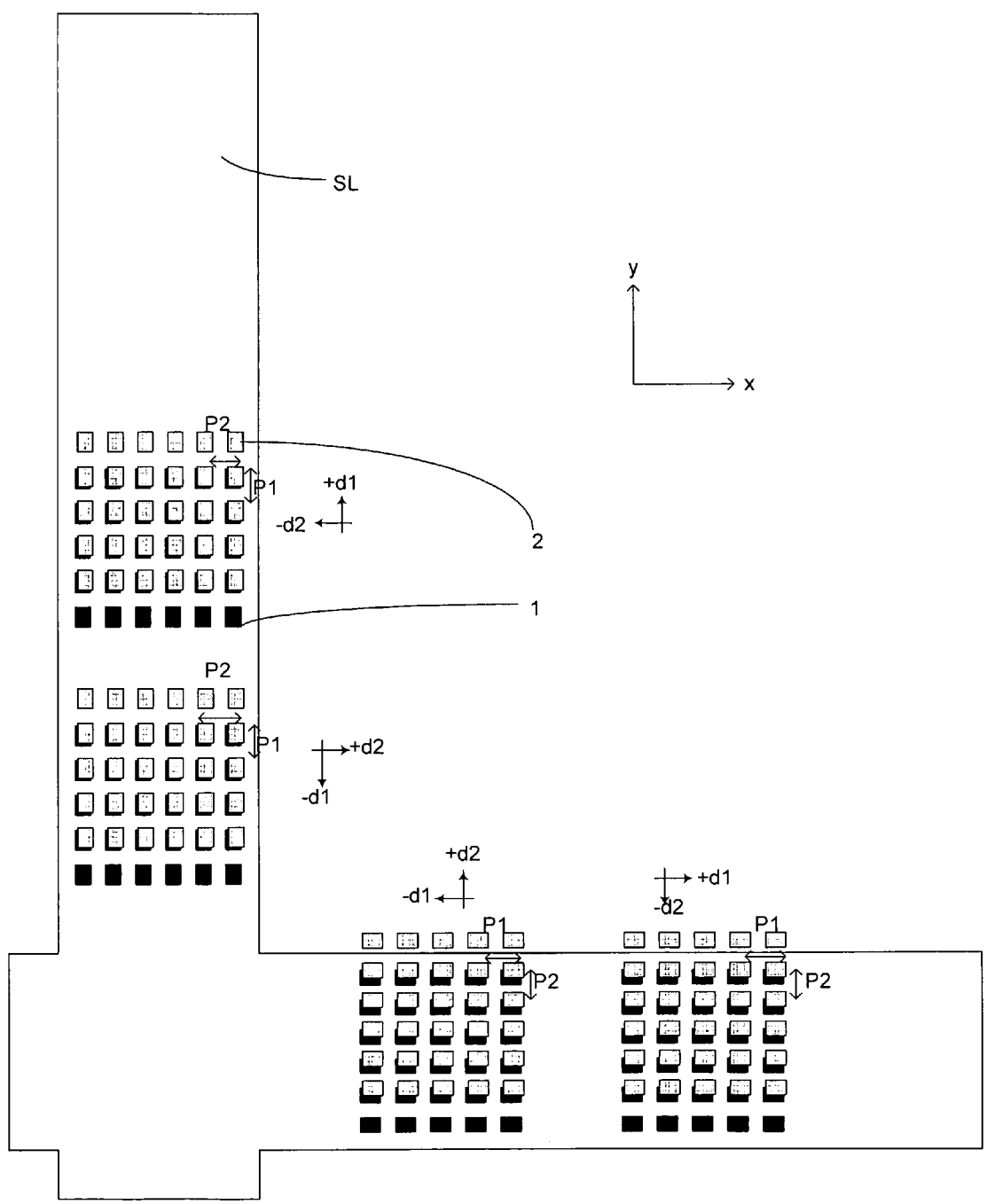
FIG. 4 depicts an example of the overlay markers according to the second embodiment in use.

In order to be able to measure misalignments of more than the pitch of the grating, the present invention may comprise an overlay mark as shown in FIGS. 2, 3 and 4.

FIG. 2 shows a scribe lane SL containing an overlay target comprising four gratings. Two of the gratings are oriented perpendicularly to the two other gratings. The gratings in the scribe lane in the y direction all have a pitch P1. The gratings in the scribe lane in the x direction all have a pitch P2. The perpendicular orientation of the different overlay gratings allows for the measurement of errors in the x and y directions. The way this is done is by superposing the same formation of gratings on top of these gratings in the scribe lanes. If the gratings are aligned, the diffraction spectrum indicates this. If the gratings are misaligned by less than P1 or P2 (i.e. the pitch of the gratings), the diffraction spectrum indicates this. If the gratings are misaligned by exactly P1 (i.e. the pitch of the gratings in the y-direction scribe lane), the diffraction spectrum from the gratings in the y-direction will show the same as if the gratings are misaligned. However, the diffraction spectrum from the gratings in the x-direction, because of the difference in pitch, will create a diffraction spectrum with evidence of a misalignment. The combination of the two diffraction spectra enables the inspection apparatus to determine by how much the gratings are misaligned; and by how many multiples of P1, thanks to the extent of the misalignment of P2.

For example, if P2 is less than P1 by x1 and if the misalignment of the superposed grating is by a distance P1, the misalignment of the superposed grating in the x-direction will be by a distance of x1. However, if the misalignment is by a distance 2×P1, the misalignment of the superposed grating in the x-direction will be 2x1, which will be shown by the diffraction spectrum of the gratings in the x-direction.

It is possible to determine misalignment in this way in both x and y directions with only two gratings in each of the x- and y-direction scribe lanes; as long as there are perpendicular gratings in each scribe lane direction. In the present embodiment, the reason that there are two gratings rather than a single grating in each perpendicular direction is that the gratings have a small bias (or offset) ±d1 in the y-direction and ±d2 in the x-direction, as shown in FIG. 2. +d1 and −d1 are intentional offsets of the gratings on top of the unknown overlay error. They are used to gauge the dependency of the overlay on the asymmetry of the gratings. This can be mathematically shown as:

For grating 1 with a bias −d and unknown overlay OV, $$\text{asymmetry } A(-) = K(OV-d). \tag{1}$$

For grating 2 with a bias +d and unknown overlay OV, $$\text{Asymmetry } A(+) = K(OV+d); \tag{2}$$

where K is a constant that depends on the process and target characteristics. Using these two equations, the overlay (as well as the constant K) can be determined. The magnitude of d depends on the type of target used (e.g. the pitch and duty cycle of the gratings) and the process being used (e.g. how the different layers are processed).

The value of d is small (e.g. of the order of 10 nm) because the relation of equation (1) above only holds for a limited area near OV=0.

The TIS (systematic error of the sensor) is determined by measuring the same grating a second time, rotated 180°. The overlay will also be rotated with the grating but the TIS will have the same magnitude and sign and can then be determined and removed as an error.

As discussed above, because the gratings in the x-direction scribe lane have a different periodicity from the gratings in the y–direction scribe lane (although both gratings are orientated in the same direction), a large overlay error (e.g. larger than P1 or P2) can easily be detected by comparing the two diffraction spectrum results in either the x-direction or the y-direction.

Combinations of overlay measurements in both the x- and y-orientated gratings in both the x- and y-scribe lanes give rise to the ability to detect large and small overlay measurements in directions other than x and y by vector combination. Rotations of the substrate may also be measured in the same way.

FIG. 3 shows an embodiment of the invention that takes less scribe lane space. It is desirable to take up less scribe lane space because there are many alignment, overlay, CD and other targets, as well as all sorts of test structures, which also require scribe lane space and so the economical use of scribe lane space is desired.

Instead of the bar-gratings of FIG. 2, FIG. 3 shows a target consisting of two-dimensional gratings that have a different period in the direction of the scribe lane from that in the direction perpendicular to the scribe lane. Each of the gratings furthermore has a small bias (d1 and d2) in both the x and y directions. Again, the bias is to eliminate the TIS error of the sensor as discussed above.

Because the gratings in the x-direction scribe lane have a different periodicity in the x-direction from the gratings in the y-direction scribe lane in the same direction, a large overlay error can easily be detected by comparing the two results in the x-direction in the same way as described in relation to FIG. 2, but in less scribe lane space.

The way the overlay measurement is carried out is shown in FIG. 4. The second layer 2 is printed on top of the first layer 1. As can be seen from FIG. 4, the second layer 2 has an overlay error compared to the first layer 1 which is of the order of the pitch P1 in the y-direction of the overlay target gratings in the y-direction scribe lane. There is also a slight shift in the x-direction of the second layer 2 compared to the first layer 1, which is smaller than the pitch P2. If the overlay targets in the y-direction scribe lane were taken on their own, only a very small overlay error would be determined from the diffraction spectrum recorded from this overlay target. However, because of the overlay target gratings in the x-direction scribe lane, because of the different pitch P2 in the y-direction, the diffraction spectrum will show that the error is in fact larger than measured using the P1 pitched gratings alone.

The diffraction spectra from the two directions of overlay targets can be compared with each other and with library data to determine what the overlay error is. A specific overlay value will give a specific diffraction spectrum. The spectra are therefore inspected and compared with spectra of known overlay values to give the present overlay value. The difference in spectra of the two directions also gives a relative overlay, and may be combined to give an indication of rotational overlay errors as well as linear displacements in layers.

What is claimed is:

1. An inspection apparatus configured to measure a property of a substrate, comprising:
    an exposure tool configured to expose an overlay target on the substrate;
    a light source configured to illuminate the overlay target on the substrate; and
    a detector configured to detect a diffraction spectrum of the light reflected from the overlay target on the substrate, wherein the overlay target comprises at least two superposed layers, each layer containing a first grating disposed on a first lane and having a first plurality of rectangular structures and a second grating disposed on a second lane having a second plurality of rectangular structures, the first grating having a different pitch than the second grating, wherein all areas of intersection of the first and second lanes are void of gratings, and wherein the first and second gratings in each layer are substantially completely superposed on top of one another.

2. The inspection apparatus of claim 1, wherein each layer of the overlay target comprises two sets of gratings, a first set disposed on the first lane and comprising two gratings with a perpendicular orientation to each other and a first grating pitch and a second set disposed on the second lane comprising two gratings with a perpendicular orientation to each other and a second grating pitch.

3. The inspection apparatus of claim 2, wherein each set of gratings comprises four gratings, first and second gratings having parallel orientations and third and fourth gratings having an orientation perpendicular to the first and second gratings and parallel to each other, wherein the first and third gratings have a different offset with respect to the second and fourth offset.

4. The inspection apparatus of claim 3, wherein each of the first, second, third, and fourth gratings has an offset in a different direction.

5. The inspection apparatus of claim 1, wherein each of the first and second plurality of rectangular structures comprises a plurality of bars with a defined width and separation.

6. An inspection method, comprising:
    applying a first grating on a first lane on a first layer of a substrate, the first grating having a first pitch and a first plurality of rectangular structures;
    applying a second grating on a second lane perpendicular to the first lane on the first layer of the substrate, the second grating having a different pitch than the first grating and a second plurality of rectangular structures, wherein all areas of intersection of the first and second lane are void of gratings;
    applying a layer of resist onto the first layer of the substrate;
    applying, to the resist layer, a third and a fourth grating substantially similar in structure and orientation to the first and second gratings, respectively, the third and fourth gratings being substantially completely superposed on top of the first and second gratings;
    illuminating the superposed gratings with an overlay radiation beam;
    measuring a diffraction spectra of light reflected from the superposed gratings; and
    comparing the measured diffraction spectra from each perpendicular superposed grating pair to each other and with model data to determine an extent of overlay of the superposed layers of gratings.

7. An inspection method, comprising:
    applying a first grating along a y-direction of a first scribe lane in a first layer of a substrate, the first grating comprising a first array of rectangular structures with a first pitch in a first direction and a second pitch in a perpendicular direction;
    applying a second grating along an x-direction of a second scribe lane perpendicular to the first scribe lane in the first layer of the substrate, the second grating comprising a second array of rectangular structures with a second pitch in the first direction and the first pitch in the perpendicular direction, wherein all areas of intersection of the first and second scribe lanes are void of gratings;
    applying a layer of resist onto the first layer of the substrate;
    applying, to the resist layer, a third and a fourth grating substantially similar in structure and orientation to the first and second gratings, respectively, the third and fourth gratings being substantially completely superposed on top of the first and second gratings;
    illuminating the superposed gratings with an overlay radiation beam;
    measuring a diffraction spectra of light reflected from the superposed gratings; and
    comparing the measured diffraction spectra from each perpendicular superposed grating pair to each other and with model data to determine an extent of overlay of the superposed layers of gratings.

8. A lithographic apparatus configured to measure a property of a substrate, comprising:
    an exposure tool configured to expose an overlay target on the substrate, the overlay target comprising a first grating with a first plurality of rectangular structures disposed on a first lane and a second grating with a second plurality of rectangular structures disposed on a second lane perpendicular to the first lane, wherein all areas of intersection of the first and second lanes are void of gratings, wherein the first grating has a different pitch than the second grating, and wherein the first and second gratings in each layer are substantially completely superposed on top of one another;
    a radiation source configured to supply an overlay beam to illuminate the overlay target; and
    a detector configured to detect a diffraction spectrum of the overlay beam reflected from the overlay target.

9. The lithographic apparatus according to claim 8, wherein each layer of the overlay target comprises two sets of gratings, a first set comprising two gratings with perpendicular orientations and a first grating pitch and a second set comprising two gratings with perpendicular orientations and a second grating pitch.

10. The lithographic apparatus according to claim 9, wherein each set of gratings comprises four gratings, first and second gratings having parallel orientations and third and fourth gratings having an orientation perpendicular to the first and second gratings, but parallel to each other, wherein the first and third gratings have a different offset with respect to the second and fourth gratings.

11. The lithographic apparatus according to claim 10, wherein each grating has an offset in a different direction.

12. The lithographic apparatus according to claim 8, wherein each of the first and second plurality of rectangular structures comprises a plurality of bars with a defined width and separation.

13. The lithographic apparatus according to claim 8, wherein each of the first and second plurality of rectangular structures comprises an array of rectangular structures.

14. The lithographic apparatus according to claim 13, wherein the array of rectangular structures has a first pitch in a first direction and a second pitch in a perpendicular direction.

15. The lithographic apparatus according to claim 13, wherein each layer of the overlay target comprises two sets of arrays, each set comprising two arrays of rectangular structures, a first array in each set having an offset with respect to the second array in each set.

* * * * *